(12) United States Patent
Park et al.

(10) Patent No.: US 10,236,767 B2
(45) Date of Patent: Mar. 19, 2019

(54) SEMICONDUCTOR DEVICE AND INTERNAL VOLTAGE ADJUSTING METHOD THEREOF

(71) Applicant: SK hynix Inc., Gyeonggi-do (KR)

(72) Inventors: Jae-Boum Park, Seoul (KR); Bong-Hwa Jeong, Gyeonggi-do (KR); Chang-Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/840,018

(22) Filed: Dec. 13, 2017

(65) Prior Publication Data
US 2018/0323703 A1  Nov. 8, 2018

(30) Foreign Application Priority Data

May 8, 2017 (KR) .................. 10-2017-0057541

(51) Int. Cl.
*H02M 3/07* (2006.01)
*G05F 1/56* (2006.01)
*H03K 3/03* (2006.01)

(52) U.S. Cl.
CPC .............. *H02M 3/07* (2013.01); *G05F 1/56* (2013.01); *H03K 3/0315* (2013.01)

(58) Field of Classification Search
CPC ............ H02M 3/07; G05F 1/56; H03K 3/0315
USPC ........ 327/536; 365/189.09, 189.11, 226, 227, 365/222, 211, 229
See application file for complete search history.

(56) References Cited

U.S. PATENT DOCUMENTS

2015/0029806 A1* 1/2015 Qiao .................... G11C 5/147
365/226

FOREIGN PATENT DOCUMENTS

| KR | 100803362 | 2/2008 |
|----|-----------|--------|
| KR | 1020160023185 | 3/2016 |

* cited by examiner

*Primary Examiner* — Thomas Skibinski
(74) *Attorney, Agent, or Firm* — IP & T Group LLP

(57) ABSTRACT

A semiconductor device may include a trimming circuit suitable for generating a reference voltage that is adjusted based on a code value, and an internal voltage generation circuit suitable for generating an internal voltage based on the reference voltage, wherein the internal voltage generation circuit is suitable for dividing the internal voltage in a division ratio that varies depending on an operation mode and for generating the internal voltage based on comparison of the divided internal voltage with the reference voltage.

23 Claims, 6 Drawing Sheets

SEMICONDUCTOR DEVICE AND INTERNAL VOLTAGE ADJUSTING METHOD THEREOF

CROSS-REFERENCE TO RELATED APPLICATIONS

The present application claims priority of Korean Patent Application No. 10-2017-0057541, filed on May 8, 2017, which is Incorporated herein by reference in its entirety.

BACKGROUND

1. Field

Exemplary embodiments of the present invention relate to a semiconductor device and particularly to a semiconductor device that generates an internal voltage.

2. Description of the Related Art

The voltage level of a supply or ground voltage supplied from outside a semiconductor device may momentarily change by noise or interference. Therefore, in order to stably maintain its voltage level, the semiconductor device generates various levels of internal voltages using the external supply or ground voltage. For example, in order to generate a core voltage, a semiconductor device such as DRAM (Dynamic Random Access Memory), NAND Flash, and a microprocessor compares a reference voltage and a feedback core voltage, raises the level of the core voltage when the core voltage is lower than the reference voltage level, and suppresses the generation of the core voltage when the core voltage is higher than the reference voltage level. Therefore, the level of the generated internal voltage can be adjusted properly based on the level of the reference voltage.

However, a variety of processes may be involved in fabricating one semiconductor device, and each of the processes may not be performed in the same manner. As many processes are performed, the widths, lengths, and ion doping concentrations of transistors included in the respective chips may be different from each other. That is, the semiconductor device may include transistors having slightly different threshold voltages or current supply abilities from the originally-intended design.

When the characteristics of internal circuits in semiconductor devices vary, their internal voltages may have different levels from the designed target level. In order to adjust the level of the internal voltages, which may vary by process variation, to the design target level, the level of the internal voltages may be sensed through a test, and the level of a reference voltage for the internal voltages may be trimmed.

For example, the level of the reference voltage may be adjusted through a test at a wafer processing step of semiconductor chips. Semiconductor chips in the same wafer subjected to the same process may not have the same reference voltage level and rather reference voltage levels would likely spread in a certain distribution range. For this reason, a reference voltage trimming circuit for adjusting a voltage division ratio to tune the reference voltage to the target level is used at the wafer processing step for a semiconductor device. That is, at the wafer processing step, the reference voltage trimming circuit can be used to adjust the reference voltage to the target level.

Therefore, there is a demand for a method for reducing deviation in the internal voltages more effectively using the trimming operation of the reference voltage.

SUMMARY

Various embodiments are directed to an internal voltage adjusting method capable of reducing a deviation in internal voltages generated by a plurality of semiconductor devices.

In accordance with an embodiment of the present invention, a semiconductor device includes: a trimming circuit suitable for generating a reference voltage that is adjusted based on a code value; and an internal voltage generation circuit suitable for generating an internal voltage based on the reference voltage, wherein the internal voltage generation circuit is suitable for dividing the internal voltage in a division ratio that varies depending on an operation mode and for generating the internal voltage based on comparison of the divided internal voltage with the reference voltage.

In accordance with an embodiment of the present invention, an internal voltage adjusting method includes: generating, by a plurality of semiconductor devices, internal voltages based on a pre-target level having a difference from a target level, the difference corresponding to half of a correction level; dividing the plurality of semiconductor devices based on the generated internal voltages; and adjusting the internal voltages of the divided semiconductor devices by the correction level.

In accordance with an embodiment of the present invention, an internal voltage adjusting method includes: generating, by a plurality of semiconductor devices, internal voltages based on a target level; detecting a semiconductor device in which a generated internal voltage is less or more than the target level by half of a deviation, among the plurality of semiconductor devices; adjusting the internal voltage of the detected semiconductor device by half of the deviation.

DETAILED DESCRIPTION

Figure 1:
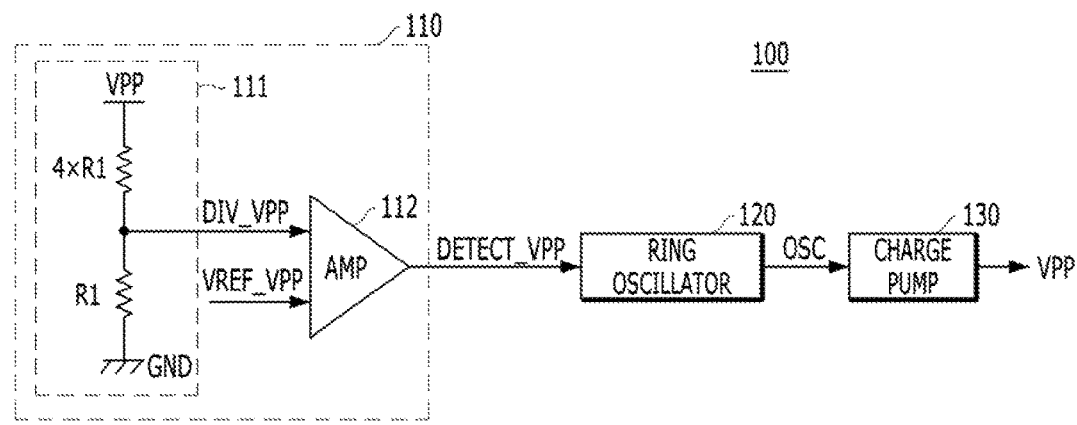
FIGS. 1 and 2 are block diagrams illustrating internal voltage generation circuits of a semiconductor device according to one embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
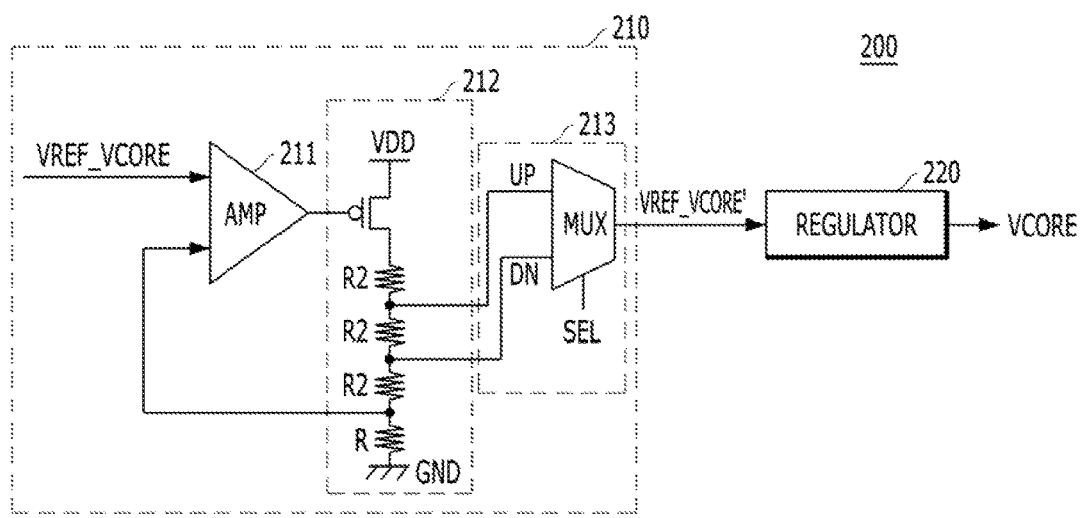
Figure 3:
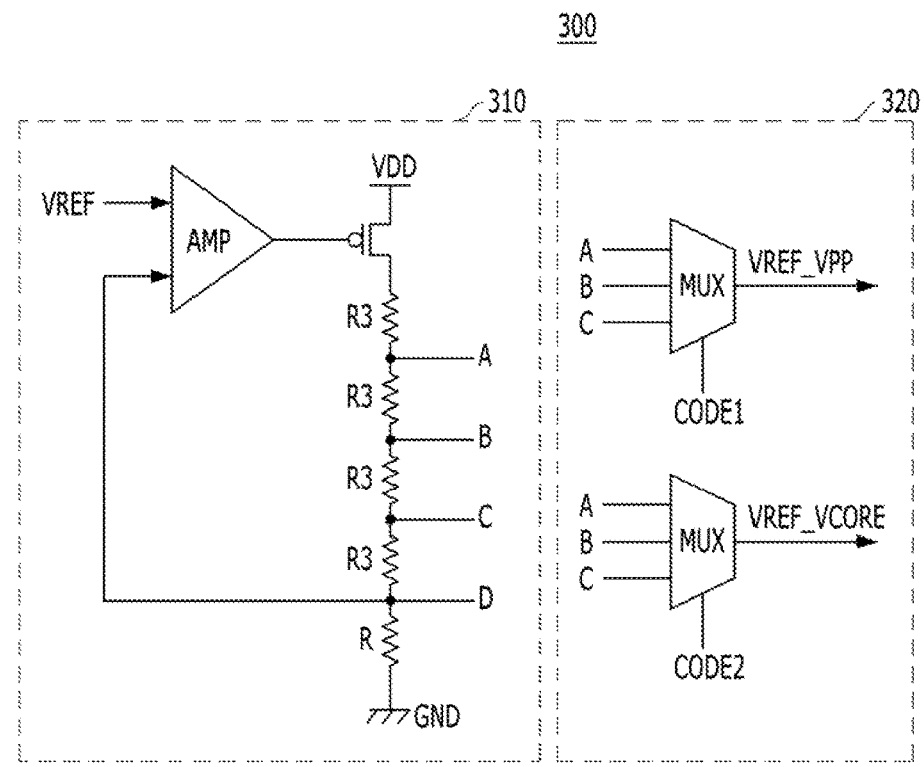
FIG. 3 is a block diagram illustrating a trimming circuit for providing a reference voltage to the internal voltage generation circuits of FIGS. 1 and 2 according to one embodiment.

With reference to FIGS. 1 to 3, an internal voltage generation circuit of a semiconductor device according to one exemplary embodiment is described.

FIGS. 1 and 2 are block diagrams illustrating internal voltage generation circuits of a semiconductor device according to one embodiment. FIG. 1 illustrates an internal voltage generation circuit using a charge pumping method, and FIG. 2 illustrates an internal voltage generation circuit using a regulating method.

First, referring to FIG. 1, the internal voltage generation circuit 100 includes a level detector 110, a ring oscillator 120, and a charge pump 130.

In accordance with one exemplary embodiment, the level detector 110 compares a reference voltage VREF_VPP with a feedback internal voltage, for example, a high voltage VPP, and detects the level of the high voltage VPP such that the high voltage VPP can maintain a constant voltage level. That is, the level detector 110 compares the high voltage VPP with the reference voltage VREF_VPP and outputs a detection signal DETECT_VPP, for example, when the high voltage VPP is lower than the reference voltage VREF_VPP. The level detector 110 includes a divider 111, for example, having resistors 5*R1 coupled in series between the high voltage terminal VPP and a ground voltage terminal GND and a comparator 112 implemented with a differential amplifier AMP. The comparator 112 may compare a high voltage DIV_VPP divided by the divider 111 with the reference voltage VREF_VPP.

In accordance with one exemplary embodiment, the ring oscillator 120 generates an oscillation signal OSC for generating the high voltage VPP in response to the detection signal DETECT_VPP. The charge pump 130 performs a charge pumping operation based on the oscillation signal OSC. In one example, when the divided high voltage DIV_VPP is lower than the reference voltage VREF_VPP, the internal voltage generation circuit 100 generates the high voltage VPP by boosting an external supply voltage.

Referring to FIG. 2, the internal voltage generation circuit 200 includes a reference voltage generator 210 and a regulator 220.

The reference voltage generator 210 may receive a reference voltage, for example, a reference voltage VREF_VCORE for a core voltage from a trimming circuit 300 (with reference to FIG. 3), and selectively raise/lower the reference voltage. The reference voltage generator 210 includes a comparator 211, a divider 212, and a selector 213.

The comparator 211 includes a differential amplifier AMP to pass a constant current set by a resistor R to the divider 212 by a feedback operation of the differential amplifier AMP. The divider 212 may include resistors R2 coupled in series and having the same size and output voltage levels to first and second nodes UP and DN in between the resistors R2, the voltage levels having a predetermined deviation according to a resistance ratio of the resistors R2. The selector 213 includes a multiplexer MUX to select from the voltage levels of the first and second nodes UP and DN according to a select signal SEL and to output a reference voltage VREF_VCORE' that may be higher by a predetermined level than the core voltage VCORE.

In accordance with one exemplary embodiment, the regulator 220 includes an LDO (Low-Drop Out) regulator. The regulator 220 may be implemented with a differential amplifier and transistor (not illustrated) and generate the core voltage VCORE by dropping the reference voltage VREF_VCORE' outputted from the reference voltage generator 210 by a predetermined level.

FIG. 3 is a block diagram illustrating a trimming circuit 300 for adjusting the reference voltage provided to the internal voltage generation circuits of FIGS. 1 and 2 according to one exemplary embodiment.

The trimming circuit 300 may output the reference voltages VREF_VPP and VREF_VCORE by which the internal voltage generation circuits 100 and 200 generate the internal voltages VPP and VCORE. The trimming circuit 300 may separately adjust the levels of the reference voltages VREF_VPP and VREF_CORE to offset process variation in the semiconductor device. The trimming circuit 300 includes a divider 310 and a selector 320, and trims the levels of the reference voltages VREF_VPP and VREF_VCORE through the following test process.

First, the trimming circuit 300 generates the reference voltages VREF_VPP and VREF_VCORE at predetermined levels using codes CODE1 and CODE2 set at default values, and the internal voltage generation circuits 100 and 200 may generate the internal voltages VPP and VCORE based on the reference voltages VREF_VPP and VREF_VCORE. During the test process, the trimming circuit 300 may monitor the internal voltages VPP and VCORE generated in the semiconductor device and change the codes CODE1 and CODE2 to scan the internal voltages VPP and VCORE based on the reference voltages VREF_VPP and VREF_VCORE having various levels A to C. Thus, the trimming circuit 300 may secure the codes CODE1 and CODE2 when the internal voltages VPP and VCORE are the closest to the target level, program the codes CODE1 and CODE2, for instance, into a fuse circuit of the semiconductor device, and end the test for trimming the reference voltages VREF_VPP and VREF_VCORE of the semiconductor device.

However, the test using the trimming circuit 300 as shown in FIG. 3 according to one embodiment may have limited trimming resolutions. Referring to FIG. 3, the trimming circuit 300 may divide one reference voltage VREF through several (e.g., three) resistors having the same size, in order to generate the reference voltage at various levels. Therefore, voltages outputted to nodes A to D may have a predetermined voltage level difference, and the trimmed reference voltage cannot be adjusted by less than the predetermined difference. At this time, the minimum unit by which the reference voltage level is adjusted may be referred to as the trimming resolution.

The trimming resolution may affect a deviation in the internal voltages generated by a plurality of semiconductor devices. For example, when the internal voltage generation circuits 100 of the plurality of semiconductor devices divide the feedback high voltage VPP by 5 and compare the divided voltages with the reference voltage VREF_VPP as illustrated in FIG. 1, the deviation in the high voltages VPP generated by the plurality of semiconductor devices may correspond to five times the size of the trimming resolution. Therefore, it is desirable to minimize the deviation in the internal voltages through the trimming operation of the reference voltage.

Figure 4:
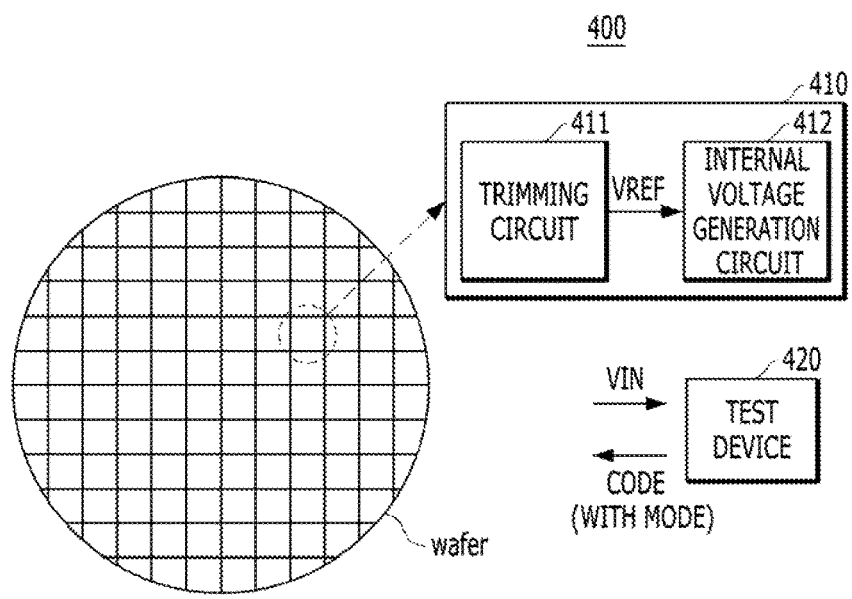
FIG. 4 is a block diagram illustrating a semiconductor device in accordance with one embodiment.

FIG. 4 is a block diagram illustrating a semiconductor device in accordance with one exemplary embodiment.

FIG. 4 illustrates a system 400 for adjusting internal voltages of a plurality of semiconductor devices 410 according to one exemplary embodiment. The system 400 may further include a test device 420 for adjusting and testing the internal voltages of the plurality of semiconductor devices 410. In accordance with an embodiment, the plurality of semiconductor devices 410 may include memory dies on a wafer, and the test device 420 may include test equipment for testing the memory dies at the wafer level. However, one skilled in the art will readily appreciate that the present embodiment may apply to any suitable one of the semiconductor manufacturing processes and is not limited to a testing environment.

Each of the semiconductor devices 410 may include a trimming circuit 411 and an internal voltage generation circuit 412. The trimming circuit 411 may generate a reference voltage VREF which is adjusted according to a code value CODE. The internal voltage generation circuit 412 may generate an internal voltage VIN to be used in an internal circuit of the semiconductor device 410 based on the reference voltage VREF. In accordance with one embodiment, the internal voltage generation circuit 412 may divide the internal voltage VIN in a different division ratio depending on an operation mode and generate the internal voltage VIN by comparing the divided internal voltage with the reference voltage VREF. That is, the division ratio of the internal voltage VIN of the internal voltage generation circuit 412 may be adjusted according to an operation mode signal MODE indicating an operation mode.

The test device 420 may monitor the internal voltage VIN of the semiconductor device 410 and set the code value CODE for adjusting the reference voltage VREF of the semiconductor device 410 or the operation mode signal MODE for adjusting the division ratio of the internal voltage VIN, according to the monitoring result. The test device 420 may transmit the set code value CODE or operation mode signal MODE to the semiconductor device 410, and the semiconductor device 410 may program the received code value CODE or operation mode signal MODE into a fuse circuit or the like therein.

Figure 5:
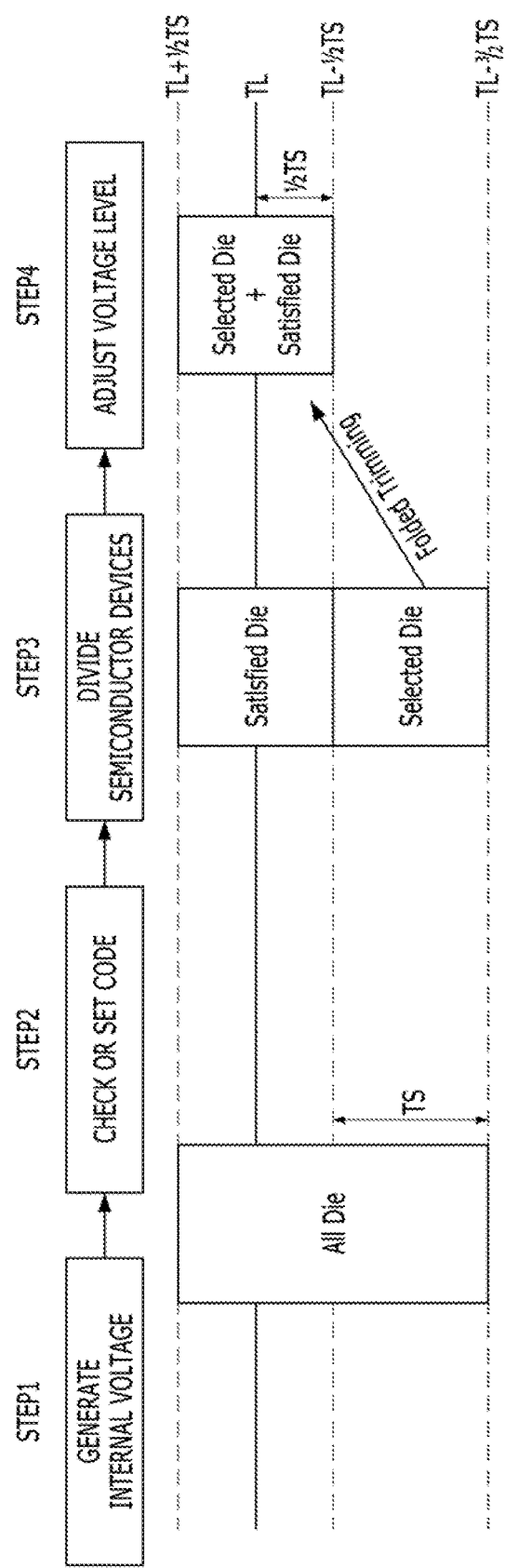
FIG. 5 is a flowchart illustrating a method for adjusting an internal voltage of a semiconductor device in accordance with one embodiment.

FIG. 5 is a flowchart illustrating a method for adjusting the internal voltage VIN of the semiconductor device 410 in accordance with one embodiment. As described above, the internal voltage VIN generated by the internal voltage generation circuit 412 may have a deviation TS corresponding to the trimming resolution of the trimming circuit 411 around a target level TL. Here, the "deviation" may be regarded as a statistical standard deviation in a set of distributed data, which may be, for example, internal voltage values measured from multiple semiconductor devices.

First, during a trimming operation, the semiconductor device 410 may generate the internal voltage VIN based on a pre-target level TL±½TS having a difference from the target level TL, the difference corresponding to half of a correction level, for example, a level corresponding to the deviation TS, at first step STEP1. FIG. 5 illustrates that the semiconductor device 410 generates the internal voltage VIN based on a pre-target level TL−½TS, which is lower than the target level TL by half of the deviation TS.

For this operation, the test device 420 may monitor the internal voltage VIN of the semiconductor device 410 based on the pre-target level TL−½TS. While changing the code value CODE of the trimming circuit 411, the test device 420 may compare the internal voltage VIN generated in each case with a test voltage having the pre-target level TL−½TS.

By monitoring the internal voltage VIN, the test device 420 may check the code value CODE when the internal voltage VIN is the closest to the pre-target level TL−½TS, at second step STEP2. The test device 420 may set the checked code value CODE in the semiconductor device 410. For example, the semiconductor device 410 may program the code value CODE into a fuse circuit (not illustrated) included therein.

After the trimming operation, the test device 420 may divide or categorize the semiconductor devices 410 based on the pre-target level TL−½TS at third step STEP3. That is, the test device 420 may detect semiconductor devices in which the internal voltage VIN is lower than the pre-target level TL−½TS, among the semiconductor devices 410. For instance, the test device 420 may detect semiconductor devices in which the internal voltage VIN generated on the basis of the set code value CODE is lower than the pre-target level TL−½TS, among the semiconductor devices 410.

The test device 420 may adjust the internal voltage VIN of the detected semiconductor devices by the correction level or the level corresponding to the deviation TS at fourth step STEP4. For example, the test device 420 may lower the division ratio of the internal voltage of the detected semiconductor device, in order to increase the internal voltage VIN by the level corresponding to the deviation TS.

For this operation, the test device 420 may separately set the operation mode of the detected semiconductor device and transmit information MODE corresponding to the operation mode to the detected semiconductor device. The test device 420 may additionally set the operation mode of the detected semiconductor device, while setting the code values CODE of the respective semiconductor devices 410. Alternatively, the test device 420 may separately set the operation mode corresponding to the detected semiconductor device, after setting the code values CODE of all the semiconductor devices 410.

The operation mode information MODE and the code value CODE may be simultaneously programmed into the fuse circuit of the semiconductor device 410, but the present embodiment is not limited thereto. The test device 420 may set the operation mode in various manners, and the operation of adjusting the internal voltage VIN of the semiconductor device 410 according to the set operation mode will be described in more detail with reference to FIGS. 6 and 7.

FIG. 5 also illustrates a distribution of the internal voltages VIN of the semiconductor devices 410 at each step. First, since the semiconductor device 410 generates the internal voltage VIN based on the pre-target level TL−½TS at first step STEP 1, the internal voltage VIN may range from TL+½TS to TL−3/2TS.

Then, at fourth step STEP 4, the test device 420 may increase the internal voltage VIN that is lower than the pre-target level TL−½TS by the level corresponding to the deviation TS. Therefore, the internal voltage VIN that ranged from TL−½TS to TL−3/2TS may be increased to range from TL+½TS and TL−½TS. As a result, the deviation of the internal voltage VIN depending on the trimming resolution may be reduced in half (½TS).

The operation of generating the internal voltage based on the target level and then selectively increasing the generated internal voltage is referred to as a folded trimming operation. The folded trimming operation can be implemented through a configuration capable of changing the division ratio of the internal voltage in the internal voltage generation circuit. This configuration will be described in more detail with reference to FIGS. 6 and 7.

FIG. 5 illustrates that the pre-target level TL−½TS is lower by the half of the deviation TS than the target level TL according to one embodiment. However, the pre-target level may be set appropriately depending on the particular correction model being used. In another embodiment, for example, the pre-target level TL+½TS may be set to be higher by the half of the deviation TS than the target level TL. In this case, the test device 420 may detect a semiconductor device in which the internal voltage VIN is higher than the pre-target level TL+½TS, among the semiconductor devices 410 and reduce the internal voltage VIN by a voltage level corresponding to the deviation TS by raising the internal voltage division ratio of the detected semiconductor device.

Figure 6:
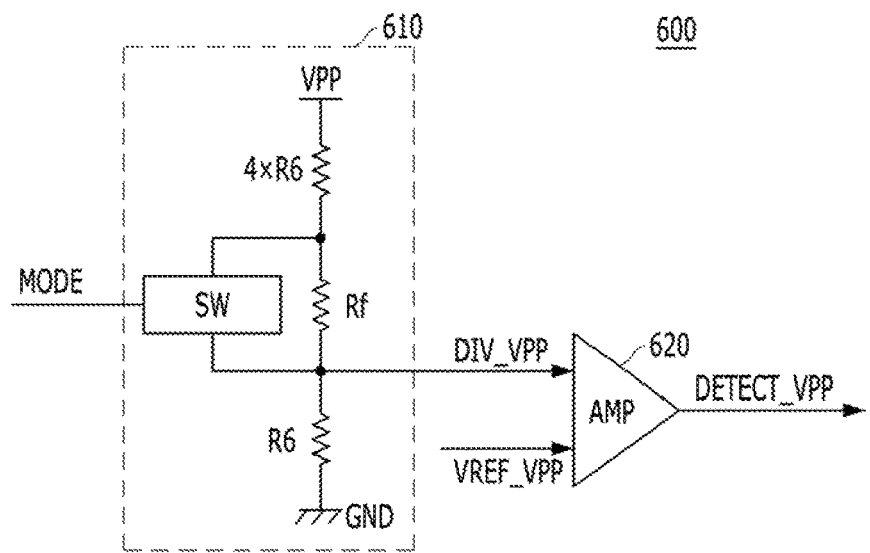
FIGS. 6 and 7 are circuit diagrams illustrating the configuration of an internal voltage generation circuit of FIG. 4 in accordance with one embodiment.
Figure 7:
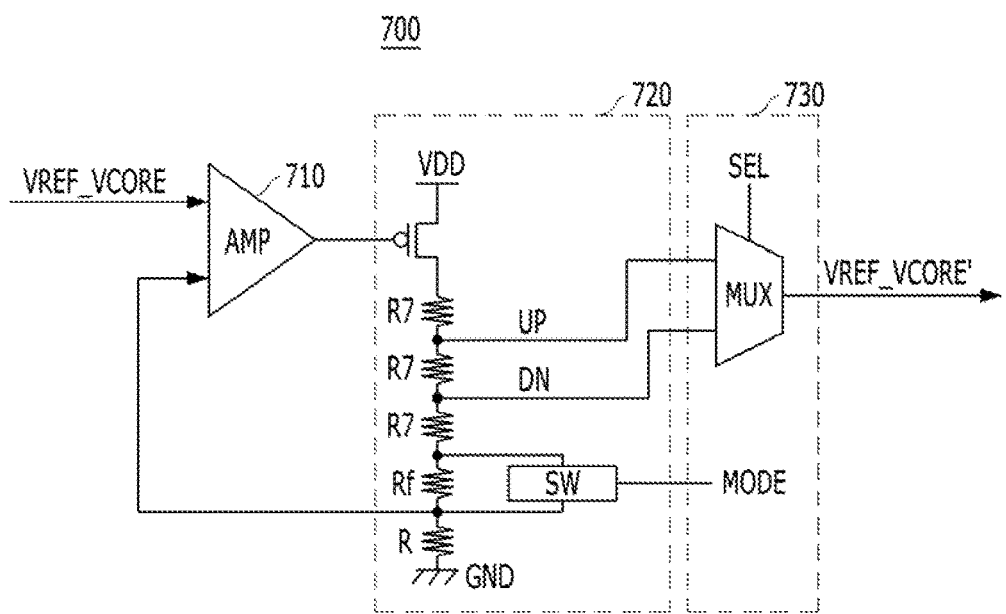

FIGS. 6 and 7 are circuit diagrams illustrating the configuration of the internal voltage generation circuit 412 of FIG. 4 in accordance with one embodiment.

The internal voltage generation circuit 412 may include the components of the internal voltage generation circuits illustrated in FIGS. 1 and 2. The following descriptions will be focused on different components from those of the internal voltage generation circuits illustrated in FIGS. 1 and 2.

FIG. 6 illustrates a level detector 600 of the internal voltage generation circuit 412 based on the charge pumping method. The level detector 600 may include a divider 610 for dividing a high voltage VPP and a comparator 620 for comparing the divided high voltage DIV_VPP with a reference voltage VREF_VPP.

The divider 610 may adjust the division ratio according to the operation mode signal MODE and generate the divided high voltage DIV_VPP by dividing the high voltage VPP in an adjusted division ratio. The divider 610 may include resistors 4*R6, Rf, and R6 coupled in series between the high voltage terminal VPP and a ground voltage terminal GND. The divider 610 may include a first resistor Rf, second resistors 4*R6 and R6, and a switch SW coupled in parallel to the first resistor Rf. The switch SW may be closed/opened in response to an activation/deactivation of the operation mode signal MODE.

Referring to FIGS. 4 and 5, the trimming operation of the semiconductor devices 410 will be described. In accordance with one embodiment, the operation mode signals MODE of the semiconductor devices 410 may be activated. At this time, the high voltages VPP generated by the semiconductor devices 410 may be monitored based on a pre-target level TL−5*½TS that is lower than the target level TL by half of the correction level. When the high voltage VPP is divided by 5 as in the divider 610 of FIG. 6, the correction level corresponds 5 times the deviation TS.

Therefore, the switch SW of the divider 610 may be closed, and the internal voltage generation circuit 412 may generate the high voltage VPP based on the pre-target level TL−5*½TS, while the code value CODE is adjusted by the test device 420. That is, the divider 610 may generate a detection signal DETECT_VPP by comparing the high voltage DIV_VPP divided by the second resistor 4*R6 and R6 with the reference voltage VREF. The internal voltage generation circuit 412 may generate the high voltage VPP based on the generated detection signal DETECT_VPP, and the test device 420 may set the code value CODE when the generated high voltage VPP is the closest to the pre-target level TL−5*½TS.

After the trimming operation or at third step STEP 3 of FIG. 5, the test device 420 may detect a semiconductor device in which the high voltage VPP is lower than the pre-target level TL−5*½TS and separately set the operation mode of the detected semiconductor device. That is, when the high voltage VPP generated by the internal voltage generation circuit 412 based on the set code value CODE is lower than the pre-target level TL−5*½TS, the operation mode signal MODE may be deactivated. As a result, the switch SW of the divider 610 may be opened. Thus, the high voltage DIV_VPP divided by the first resistor Rf and the second resistor 4*R6 and R6 of the divider 610 may be compared with the reference voltage VREF, and the detection signal DETECT_VPP may be generated.

Since the high voltage DIV_VPP divided in the division ratio lowered in the divider 610 is compared with the reference voltage VREF, the internal voltage generation circuit 412 may further perform a charge pumping operation to increase the level of the high voltage VPP. The level of the high voltage VPP may increase in proportion to the size of the first resistor Rf, and the first resistor Rf may have a size to increase the high voltage VPP by a level corresponding to the deviation TS. When the high voltage VPP is divided by 5 as in the divider 610 of FIG. 6, the high voltages VPP of the plurality of semiconductor devices 410 may be distributed in the range of TL+5*½TS to TL−5*3/2TS around the pre-target level TL−5*½TS during the trimming operation. The high voltage VPP of the detected semiconductor device may be increased as much as the level 5*TS corresponding to the deviation TS, and the high voltages VPP of the plurality of semiconductor devices 410 may be distributed in the range of TL+5*½TS to TL−5*½TS.

FIG. 7 illustrates a reference voltage generator 700 of the internal voltage generation circuit based on a regulating method. The reference voltage generator 700 may include a comparator 710, a divider 720, and a selector 730.

The comparator 710 may include a differential amplifier AMP and pass a constant current decided by a resistor R to the divider 720 by a feedback operation of the differential amplifier AMP. The divider 720 may also adjust the division ratio according to the operation mode signal MODE and divide a supply voltage VDD. The divider 720 may include a first resistor Rf and second resistors R7 that are coupled in series between the supply voltage terminal VDD and a ground voltage terminal GND. The second resistors R7 may have the same resistance values as each other. The divider 720 may further include a switch SW coupled in parallel to the first resistor Rf, and the switch SW may be closed/opened in response to an activation/deactivation of the operation mode signal MODE. Although FIG. 7 shows that the switch SW and the first resistor Rf are positioned between the resistor R and a second resistor R7, it should be noted that the switch SW and the first resistor Rf may be positioned at any other suitable node, for instance, between any two adjacent second resistors R7 according to another embodiment.

Referring to FIGS. 4 and 5, the trimming operation of the semiconductor devices 410 will be described. In accordance with one embodiment, the operation mode signals MODE of the semiconductor devices 410 may be enabled. At this time, core voltages VCORE generated by the semiconductor devices 410 may be monitored based on a pre-target level TL−½TS that is lower by the half of the correction level than the target level TL.

Therefore, the switch SW of the divider 720 may be closed, and the internal voltage generation circuit 412 may generate the core voltage VCORE based on the pre-target level TL−½TS, while the code value CODE is adjusted by the test device 420. That is, voltage levels with a predetermined deviation may be outputted to first and second nodes UP and DN by the second resistors R7 in the divider 720. As a result, the internal voltage generation circuit 412 may generate the core voltage VCORE based on a reference voltage VREF_VCORE' raised/lowered by the selector 730. The test device 420 may set the code value CODE when the generated core voltage VCORE is the closest to the pre-target level TL−½TS.

After the trimming operation or at third step STEP 3 of FIG. 5, the test device 420 may detect a semiconductor device in which the core voltage VCORE is lower than the pre-target level TL−½TS, and separately set the operation mode of the detected semiconductor device. That is, when the core voltage VCORE generated by the internal voltage generation circuit 412 based on the set code value CODE is lower than the pre-target level TL−½TS, the operation mode signal MODE may be deactivated. As a result, the switch SW of the divider 720 may be opened. Therefore, the voltage levels of the first and second nodes UP and DN may be constantly raised by the first resistor Rf of the divider 720. At this time, the levels of the reference voltage VREF_VCORE' and the core voltage VCORE may increase in proportion to the size of the first resistor Rf, and the first resistor Rf may have a size to increase the core voltage VCORE by the level corresponding to the deviation TS.

During the trimming operation, the core voltages VCORE of the plurality of semiconductor devices 410 may be distributed in the range of TL+½TS to TL−3/2TS around the pre-target level TL−½TS. The core voltage VCORE of the detected semiconductor device may be increased as much as the level corresponding to the deviation TS, and the core voltages VCORE of the plurality of semiconductor devices 410 may be distributed in the range of TL+½TS to TL−½TS.

The internal voltage generation circuits of FIGS. 6 and 7 are based on the internal voltage adjusting method in accordance with one embodiment as shown in FIG. 5. However, exemplary embodiments of the present disclosure are not limited thereto. That is, during the trimming operation, the operation mode signals MODE of the semiconductor devices 410 may be deactivated. At this time, the internal voltages VIN generated by the semiconductor devices 410 may be monitored based on the pre-target level that is higher than the target level by half of the correction level.

In this case, the test device 420 may detect a semiconductor device in which the internal voltage VIN is more than the pre-target level after the trimming operation and separately set the operation mode of the detected semiconductor device. In other words, when the internal voltage VIN generated by the internal voltage generation circuit 412 based on the set code value CODE is more than the pre-target level, the operation mode signal MODE may be activated. As a result, the internal voltage generation circuit 412 may raise the internal voltage division ratio to reduce the internal voltage VIN by the correction level.

Figure 8:
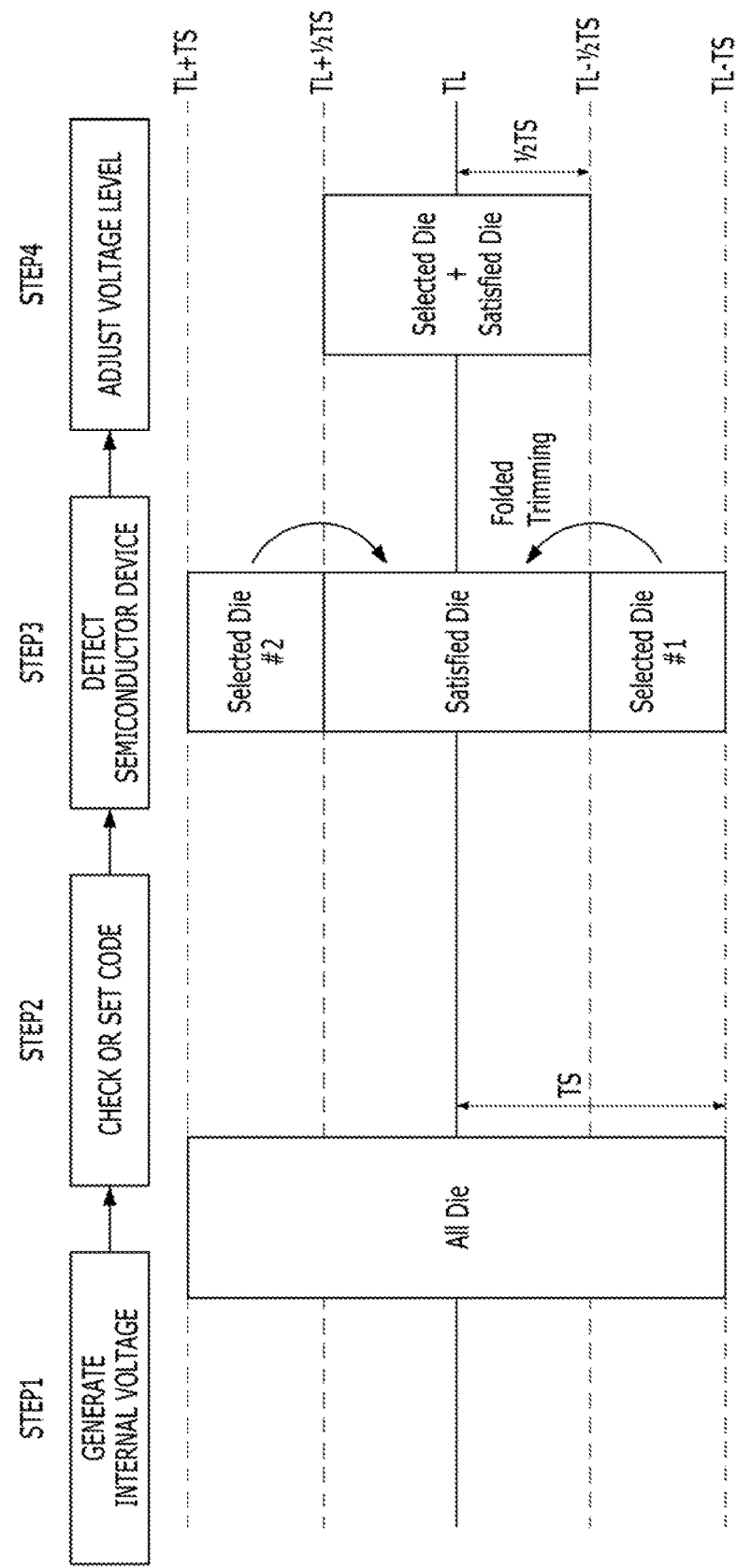
FIG. 8 is a flowchart illustrating a method for adjusting an internal voltage of a semiconductor device in accordance with another embodiment.

FIG. 8 is a flowchart illustrating a method for adjusting the internal voltage VIN of the semiconductor device 410 in accordance with another embodiment. As described above, the internal voltage VIN generated by the internal voltage generation circuit 412 may have a deviation TS corresponding to the trimming resolution of the trimming circuit 411 around the target level TL.

First, during a trimming operation, the semiconductor device 410 may generate the internal voltage VIN based on the target level TL at first step STEP1. For this operation, the test device 420 may monitor the internal voltage VIN of the semiconductor device 410 based on the target level TL. While changing the code value CODE of the trimming circuit 411 or adjusting the reference voltage VREF of the internal voltage VIN, the test device 420 may compare the internal voltage VIN generated in each case with a test voltage having the target level TL.

By monitoring the internal voltage VIN, the test device 420 may check the code value CODE when the internal voltage VIN is the closest to the target level TL, at second step STEP2. The test device 420 may set the checked code value CODE in the semiconductor device 410. For example, the semiconductor device 410 may program the code value CODE into a fuse circuit (not illustrated) included therein.

As described above, when the code value CODE is set by the test device 420, the internal voltages VIN of the semiconductor devices 410 may be distributed in the range of TL+TS to TL−TS around the target level TL. At third step STEP3, the test device 420 may detect a semiconductor device in which the internal voltage VIN is outside the range of TL+½TS to TL−½TS (e.g., ½TS corresponding to half of the deviation based on the target level TL) among the semiconductor devices 410. That is, the test device 420 may select a first semiconductor device Selected Die #1 in which the internal voltage VIN generated on the basis of the set code value CODE is less than the level TL−½TS (e.g., ½TS corresponding to half of the deviation with respect to the target level TL) and a second semiconductor device Selected Die #2 in which the internal voltage VIN is more than the level TL+½TS (e.g., ½TS corresponding to half of the deviation with respect to the target level TL) among semiconductor devices 410.

The test device 420 may adjust the internal voltage VIN of the detected semiconductor device by the level ½TS corresponding to the half of the deviation at fourth step STEP4. For this operation, the test device 420 may separately set the operation mode of the detected semiconductor device, and transmit information UPMODE/DNMODE corresponding to the operation mode to the detected semiconductor device. According to the transmitted operation mode information UPMODE/DNMODE, the internal voltage division ratio of the detected semiconductor device may be adjusted. For example, the first semiconductor device Selected Die #1 may increase the internal voltage VIN as much as a level ½TS corresponding to the half of the deviation by lowering the internal voltage division ratio. However, the second semiconductor device Selected Die #2 may decrease the internal voltage VIN as much as the level ½TS corresponding to the half of the deviation by raising the internal voltage division ratio.

As illustrated in FIG. 8, the internal voltages VIN that is less than the level TL−½TS (e.g., ½TS corresponding to half of the deviation with respect to the target level TL) may be increased as much as the level ½TS corresponding to half of the deviation and distributed in the range of TL to TL−½TS, and the internal voltages VIN that is higher than the level TL+½TS (e.g., ½TS corresponding to half of the deviation with respect to the target level TL) may be decreased as much as the level ½TS corresponding to half of the deviation and distributed in the range of TL+½TS to TL. Therefore, the internal voltages VIN of the semiconductor devices 410 may be distributed in the range of TL+½TS to TL−½TS.

Figure 9:
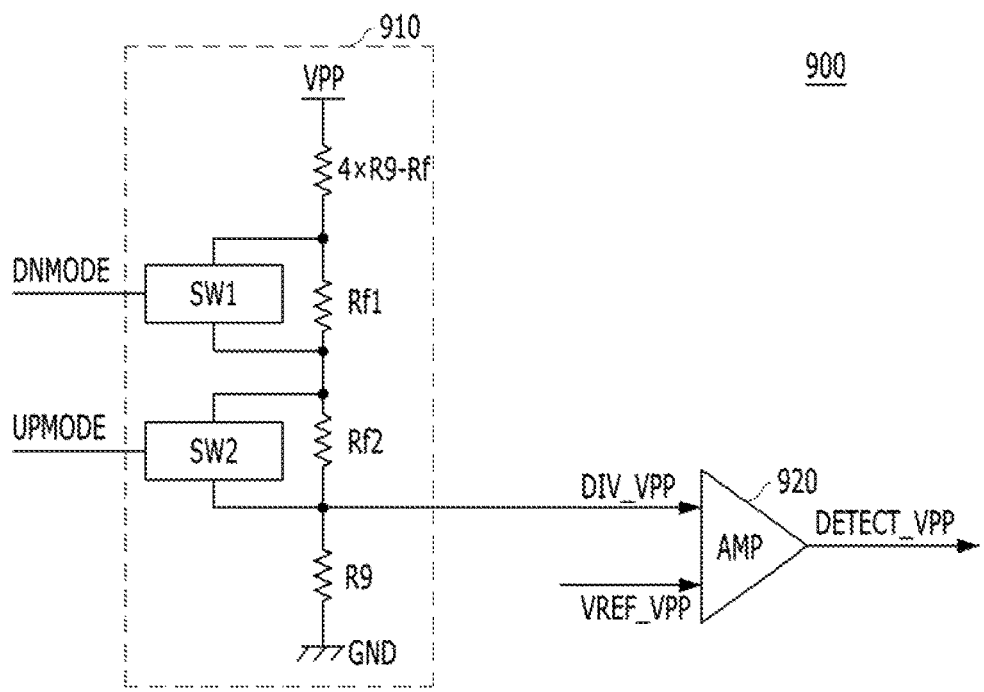
FIG. 9 is a circuit diagram illustrating the configuration of the internal voltage generation circuit of FIG. 4 in accordance with another embodiment.

FIG. 9 is a circuit diagram illustrating the configuration of the internal voltage generation circuit 412 of FIG. 4 in accordance with another embodiment.

FIG. 9 illustrates a level detector 900 of the internal voltage generation circuit 412 based on the charge pumping method. The level detector 900 may include a divider 910 for dividing the high voltage VPP and a comparator 920 for comparing the divided high voltage DIV_VPP with the reference voltage VREF_VPP.

The divider 910 may differently adjust the division ratio depending on the operation mode and generate the divided high voltage DIV_VPP by dividing the high voltage VPP at the adjusted division ratio. The divider 910 may include resistors 4*R9-Rf, Rf1, RF2, and R9 coupled in series between the high voltage terminal VPP and the ground voltage terminal GND. Furthermore, the divider 910 may further include a first switch SW1 and a second switch SW2. The first switch SW1 may be coupled in parallel to the first resistor Rf1, and opened in response to an activation of a first operation mode signal DNMODE, and the second switch SW may be coupled in parallel to the second resistor Rf2 and closed in response to an activation of a second operation mode signal UPMODE.

Referring to FIGS. 4 and 8, the trimming operations of the semiconductor devices 410 will be described. In accordance with one embodiment, the first and second operation mode signals DNMODE and UPMODE of the semiconductor devices 410 may be deactivated. At this time, the high voltages VPP generated by the semiconductor devices 410 may be monitored based on the target level TL.

That is, the first switch SW1 of the divider 910 may be closed, and the second switch SW2 may be opened. While the code value CODE is adjusted by the test device 420, the internal voltage generation circuit 412 may generate the high voltage VPP based on the target level TL. That is, the divider 910 may generate a detection signal DETECT_VPP by comparing the high voltage DIV_VPP divided by 5 through the resistors 4*R9-Rf, Rf2, and R9 with the reference voltage VREF. The internal voltage generation circuit 412 may generate the high voltage VPP based on the generated detection signal DETECT_VPP, and the test device 420 may set the code value CODE when the generated high voltage VPP is the closest to the target level TL. Therefore, the high voltages VPP of the plurality of semiconductor devices 410 may be distributed in the range of TL+5*TS to TL−5*TS around the target level TL.

After the trimming operation or at third step STEP 3 of FIG. 8, the test device may detect a first semiconductor device Selected Die #1 in which the high voltage VPP is less than a level TL−5*½TS (e.g., ½*5TS corresponding to half of the correction level 5TS with respect to the target level TL) and a second semiconductor device Selected Die #2 in which the high voltage VPP is more than a level TL+5*½TS (e.g., ½*5TS corresponding to half of the correction level 5TS with respect to the target level TL). The test device 420 may separately set the operation modes of the detected semiconductor devices.

That is, when the high voltage VPP generated by the internal voltage generation circuit 412 based on the set code value CODE is less than the level TL−5*½TS (e.g., ½*5TS corresponding to half of the correction level 5TS with respect to the target level TL), the first operation mode signal DNMODE may be activated. As a result, the first switch SW of the divider 910 may be opened. Thus, since the high voltage DIV_VPP divided in the lower division ratio by the resistors 4*R9-Rf, Rf1, Rf2, and R9 of the divider 910 is compared with the reference voltage VREF, the internal voltage generation circuit 412 may further perform a charge pumping operation to increase the level of the high voltage VPP.

On the other hand, when the high voltage VPP generated by the internal voltage generation circuit 412 is more than the level TL+5*½TS (e.g., ½*5TS corresponding to half of the correction level 5TS with respect to the target level TL), the second operation mode signal UPMODE may be activated. As a result, the second switch SW2 of the divider 910 may be closed. Thus, since the high voltage DIV_VPP divided at the higher division ratio by the resistors 4*R9-Rf and R9 of the divider 910 is compared with the reference voltage VREF, the internal voltage generation circuit 412 may decrease the level of the high voltage VPP.

The internal voltage adjusting method of FIG. 8 in accordance with one embodiment may also be applied to the internal voltage generation circuit based on the regulating method. The internal voltage generation circuit based on the regulating method may only have a different voltage generation method from the internal voltage generation circuit based on the charge pumping method in FIG. 9, and the internal voltage adjusting method in accordance with exemplary embodiments of the present disclosure may be applied to various types of internal voltage generation circuits. Therefore, the descriptions of differences therebetween are omitted herein.

Although the technical idea of the invention has been described in detail with reference to the embodiments, the embodiments are only for the descriptions, and do not limit the technical idea. For example, in the above-described configuration, the configuration in which the divider uses the resistors may be used as the configuration for changing the target level of the internal voltage in the internal voltage generation circuit. However, the divider can change the target level of the internal voltage even though active elements such as diodes are used instead of the passive elements such as the resistors. In this case, the divider may selectively change the target level of the internal voltage using diodes having different channel widths or lengths.

Furthermore, the divider can implement a multi-folded trimming operation of changing the internal voltage through various steps using a plurality of resistors having different sizes. The operation of the internal voltage generation circuit in accordance with the present embodiment may be applied to each of the steps, and it will be apparent to those skilled in the art that various changes and modifications may be made without departing from the spirit and scope of the invention as defined in the following claims.

In accordance with present embodiments, after the internal voltages of the plurality of semiconductor devices are adjusted based on the target level, a part of the semiconductor devices may be selected, and the internal voltages of the selected semiconductor devices may be additionally adjusted. Alternatively, the internal voltages of the semiconductor devices may be adjusted based on the pre-target level having a difference corresponding to the correction level from the target level, and then additionally adjusted as much as the correction level.

For this operation, the semiconductor devices may generate the internal voltages at a different ratio depending on the operation mode. Thus, since the internal voltages of the semiconductor devices are generated and adjusted through various steps after the division ratio is adjusted, the deviation in the generated internal voltages may be reduced based on the target level. As a result, the productivity of the semiconductor devices can be improved.

What is claimed is:

1. A semiconductor device comprising:
a trimming circuit suitable for generating a reference voltage that is adjusted based on a code value; and
an internal voltage generation circuit suitable for generating an internal voltage based on the reference voltage,
wherein the internal voltage generation circuit is suitable for dividing the internal voltage in a division ratio that varies depending on an operation mode and for generating the internal voltage based on comparison of the divided internal voltage with the reference voltage, and
wherein during a trimming operation in which the code value is adjusted, the internal voltage generation circuit generates the internal voltage based on a pre-target level that is different from a target level by half of a correction level.

2. The semiconductor device of claim 1, wherein the internal voltage generation circuit comprises a divider suitable for dividing the internal voltage in the division ratio being adjusted based on a signal indicating the operation mode, and
the divider comprises:
first and second resistors coupled in series between an internal voltage terminal and a ground voltage terminal; and
a switch coupled in parallel to the first resistor and suitable for closing or opening in response to an activation or deactivation of the signal indicating the operation mode.

3. The semiconductor device of claim 2, wherein during the trimming operation, the signal indicating the operation mode is activated, and the pre-target level is lower than the target level by half of the correction level.

4. The semiconductor device of claim 3, wherein after the trimming operation, the signal indicating the operation mode is deactivated when the generated internal voltage is less than the pre-target level.

5. The semiconductor device of claim 2, wherein during the trimming operation, the signal indicating the operation mode is deactivated, and the pre-target level is higher by half of the correction level than the target level.

6. The semiconductor device of claim 5, wherein after the trimming operation, the signal indicating the operation mode is activated when the generated internal voltage is more than the pre-target level.

7. The semiconductor device of claim 5, wherein the correction level corresponds to a deviation in internal voltages generated by a plurality of semiconductor devices including the semiconductor device.

8. The semiconductor device of claim 7, wherein the deviation in the internal voltages is proportional to a level by which the reference voltage is adjusted based on the code value.

9. An internal voltage adjusting method comprising:
generating, by a plurality of semiconductor devices, internal voltages based on a pre-target level that is lower than a target level by half of a correction level;
detecting a semiconductor device in which a generated internal voltage is less than the pre-target level, among the plurality of semiconductor devices; and
increasing the internal voltages of the detected semiconductor devices by the correction level by lowering an internal voltage division ratio of the detected semiconductor device.

10. The internal voltage adjusting method of claim 9, wherein the correction level corresponds to a deviation in the internal voltages generated by the plurality of semiconductor devices.

11. The internal voltage adjusting method of claim 9, wherein the generating of the internal voltages comprises:
activating operation mode signals of the plurality of semiconductor devices.

12. The internal voltage adjusting method of claim 11, wherein the increasing of the internal voltages of the detected semiconductor devices by the correction level comprises:
deactivating the operation mode signal of the detected semiconductor device;
lowering the internal voltage division ratio of the detected semiconductor device in response to the deactivated operation mode signal; and
increasing the internal voltage of the detected semiconductor device by the correction level, based on the lowered internal voltage division ratio.

13. The internal voltage adjusting method of claim 9, wherein the generating of the internal voltages comprises:
deactivating operation mode signals of the plurality of semiconductor devices; and
generating, by the plurality of semiconductor devices, the internal voltages based on the pre-target level higher than the target level by half of the correction level.

14. The internal voltage adjusting method of claim 13, wherein the dividing of the plurality of semiconductor devices comprises detecting a semiconductor device in which a generated internal voltage is more than the pre-target level, among the plurality of semiconductor devices.

15. The internal voltage adjusting method of claim 14, wherein the adjusting of the internal voltages of the divided semiconductor devices by the correction level comprises:
activating the operation mode signal of the detected semiconductor device;
raising an internal voltage division ratio of the detected semiconductor device in response to the activated operation mode signal; and
decreasing the internal voltage of the detected semiconductor device by the correction level, based on the raised internal voltage division ratio.

16. A semiconductor device comprising:
a trimming circuit suitable for generating a reference voltage that is adjusted based on a code value; and
an internal voltage generation circuit suitable for generating an internal voltage based on comparison of a divided internal voltage with the reference voltage,
wherein the internal voltage generation circuit including a divider suitable for dividing the internal voltage in a division ratio being adjusted according to an operation mode,
wherein the divider comprises:
first to third resistors coupled in series between an internal voltage terminal and a ground voltage terminal;
a first switch coupled in parallel to the first resistor and suitable for opening in response to an activation of a first operation mode signal; and
a second switch coupled in parallel to the second resistor and suitable for closing in response to an activation of a second operation mode signal
wherein during a trimming operation in which the code value is adjusted, the first and second operation mode signals are deactivated, and the internal voltage generation circuit generates the internal voltage based on a target level.

17. The semiconductor device of claim 16, wherein after the trimming operation, the first operation mode signal is activated when the generated internal voltage is less than the target level by a predetermined level.

18. The semiconductor device of claim 17, wherein the predetermined level corresponds to half of a deviation in internal voltages generated by a plurality of semiconductor devices including the semiconductor device.

19. The semiconductor device of claim 16, wherein after the trimming operation, the second operation mode signal is activated when the generated internal voltage is more than the target level by a predetermined level.

20. An internal voltage adjusting method comprising:
generating, by a plurality of semiconductor devices, internal voltages based on a pre-target level that is higher than a target level by half of a correction level;

detecting a semiconductor device in which a generated internal voltage is more than the pre-target level, among the plurality of semiconductor devices; and decreasing the internal voltages of the detected semiconductor devices by the correction level by raising an internal voltage division ratio of the detected semiconductor device.

21. The internal voltage adjusting method of claim 20, wherein the correction level corresponds to a deviation in the internal voltages generated by the plurality of semiconductor devices.

22. The internal voltage adjusting method of claim 20, wherein the generating of the internal voltages comprises:

deactivating operation mode signals of the plurality of semiconductor devices.

23. The internal voltage adjusting method of claim 22, wherein the decreasing of the internal voltages of the detected semiconductor devices by the correction level comprises:

activating the operation mode signal of the detected semiconductor device;

raising the internal voltage division ratio of the detected semiconductor device in response to the activated operation mode signal; and decreasing the internal voltage of the detected semiconductor device by the correction level, based on the raised internal voltage division ratio.

* * * * *